United States Patent
Okabe (10) Patent No.: US 11,056,154 B2
(45) Date of Patent: Jul. 6, 2021

(54) SEMICONDUCTOR MEMORY DEVICE

(71) Applicant: Winbond Electronics Corp., Taichung (TW)

(72) Inventor: Sho Okabe, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/368,868

(22) Filed: Mar. 29, 2019

(65) Prior Publication Data

US 2019/0333549 A1 Oct. 31, 2019

(30) Foreign Application Priority Data

Apr. 25, 2018 (JP) .............................. JP2018-083559

(51) Int. Cl.
| | |
|---|---|
| *G11C 5/14* | (2006.01) |
| *G11C 16/32* | (2006.01) |
| *G11C 16/26* | (2006.01) |
| *G11C 16/14* | (2006.01) |
| *G11C 16/04* | (2006.01) |
| *G11C 16/34* | (2006.01) |
| *G11C 16/10* | (2006.01) |
| *G11C 16/30* | (2006.01) |

(52) U.S. Cl.
CPC .......... *G11C 5/145* (2013.01); *G11C 16/0483* (2013.01); *G11C 16/10* (2013.01); *G11C 16/14* (2013.01); *G11C 16/26* (2013.01); *G11C 16/30* (2013.01); *G11C 16/32* (2013.01); *G11C 16/3445* (2013.01); *G11C 16/3459* (2013.01)

(58) Field of Classification Search
CPC ........... G11C 7/12; G11C 16/30; G11C 5/145; G11C 16/0483; G11C 16/26
See application file for complete search history.

(56) References Cited

U.S. PATENT DOCUMENTS

| | | | | |
|---|---|---|---|---|
| 5,519,654 | A | * | 5/1996 | Kato ...................... G11C 16/10 327/532 |
| 8,547,754 | B2 | | 10/2013 | Ha |
| 8,755,242 | B2 | | 6/2014 | Lee et al. |
| 8,860,501 | B2 | | 10/2014 | Wang et al. |

(Continued)

FOREIGN PATENT DOCUMENTS

| | | |
|---|---|---|
| CN | 101136587 | 3/2008 |
| CN | 102834827 | 12/2012 |

(Continued)

OTHER PUBLICATIONS

"Office Action of Japan Counterpart Application", dated Mar. 12, 2019, pp. 1-4.
"Office Action of Taiwan Counterpart Application", dated Jun. 12, 2019, p. 1-p. 5.
"Office Action of Korea Counterpart Application" with English translation thereof, dated Jun. 18, 2020, p. 1-p. 9.

(Continued)

*Primary Examiner* — Jay W. Radke
(74) *Attorney, Agent, or Firm* — JCIPRNET (57) ABSTRACT

A semiconductor memory device for reducing the peak current during the read operation is provided. A flash memory of the disclosure includes a memory cell array; a plurality of charge pump circuits; and a controller controlling a timing of activating the charge pump circuits when a selected page of the memory cell array is read so that the charge pump circuits are not activated at the same timing.

19 Claims, 8 Drawing Sheets

(56) References Cited

U.S. PATENT DOCUMENTS

| | | | |
|---|---|---|---|
| 2002/0141238 A1* | 10/2002 | Pasternak | G11C 16/30 365/185.11 |
| 2002/0191447 A1 | 12/2002 | Kondo et al. | |
| 2005/0265079 A1* | 12/2005 | Shirota | G11C 16/0483 365/185.21 |
| 2006/0291293 A1* | 12/2006 | Chae | G11C 8/08 365/185.23 |
| 2007/0008795 A1* | 1/2007 | Tsukada | G11C 11/4094 365/203 |
| 2008/0232174 A1* | 9/2008 | Cornwell | G11C 16/30 365/189.09 |
| 2009/0174441 A1 | 7/2009 | Gebara et al. | |
| 2009/0310414 A1* | 12/2009 | Lee | G11C 11/5635 365/185.17 |
| 2010/0067297 A1 | 3/2010 | Chae et al. | |
| 2011/0249492 A1 | 10/2011 | Kumazaki et al. | |
| 2014/0286104 A1* | 9/2014 | Kamata | G11C 16/0483 365/185.21 |
| 2017/0154666 A1* | 6/2017 | Park | G11C 11/4074 |

FOREIGN PATENT DOCUMENTS

| | | |
|---|---|---|
| JP | 2008193766 | 8/2008 |
| JP | 2010113777 | 5/2010 |
| JP | 2011223749 | 11/2011 |
| JP | 2017228325 | 12/2017 |
| KR | 9980077614 | 11/1998 |
| KR | 20030061406 | 7/2003 |
| KR | 20120105293 | 9/2012 |
| TW | 201426760 | 7/2014 |
| TW | I473112 | 2/2015 |
| TW | 201626396 | 7/2016 |
| TW | 201801085 | 1/2018 |

OTHER PUBLICATIONS

"Office Action of China Counterpart Application", dated Oct. 9, 2020, pp. 1-10.

"Office Action of Korea Counterpart Application", dated Dec. 11, 2020, with English translation thereof, p. 1-p. 7.

* cited by examiner

| | erase | write | read |
|---|---|---|---|
| selected W/L | 0 | 15~20V | 0 |
| non-selected W/L | F | 10V | 4.5V |
| SGD | F | Vdd | 4.5V |
| SGS | F | 0 | 4.5V |
| SL | F | Vdd | 0 |
| P well | 21V | 0 | 0 |

SEMICONDUCTOR MEMORY DEVICE

CROSS-REFERENCE TO RELATED APPLICATION

This application claims the priority benefit of Japan application serial no. 2018-083559, filed on Apr. 25, 2018. The entirety of the above-mentioned patent application is hereby incorporated by reference herein and made a part of this specification.

BACKGROUND

Technical Field

The disclosure relates to a semiconductor memory device, such as a flash memory, and particularly relates to control of a charge pump circuit for generating an internal voltage.

Description of Related Art

Along with the miniaturization of semiconductor design, the operating voltage for driving semiconductor elements is being lowered and the power source voltage (Vdd) supplied to the semiconductor device is being lowered as well. For example, the power source voltage supplied from the outside of the semiconductor memory has been lowered from 3.3V to 2.5V or 1.8V. On the other hand, in the internal circuit of the semiconductor memory, such as a flash memory, multiple power sources may be required. For example, the voltage for driving a transistor, the voltage applied to a substrate or a well, etc. may need to be high voltages higher than the power source voltage. Therefore, the semiconductor device is provided with a voltage generation circuit that includes a charge pump circuit, a level shifter, or the like for boosting the power source voltage supplied from the outside to a desired voltage (Japanese Laid-open Patent Application No. 2017-228325).

In the NAND type flash memory, high voltages are required for the operations of reading, programming, and erasing data, and therefore a charge pump circuit for generating high voltages is provided inside. The current consumption of the flash memory is largely due to the charge pump circuit. Especially, in the bit line precharge period during the read operation or the verification operation, the maximum peak current occurs when the charge pump circuit is activated. For example, a read voltage Vpass to be applied to the non-selected page (or non-selected word line) of the selected block is generated by the charge pump circuit, or a voltage VXD for driving a selected transistor, which is for supplying the power source voltage Vdd to the bit line, is generated by the charge pump circuit. Therefore, the current consumption caused by the charge pump circuit rises as the number of pages or the number of bit lines increases.

When the peak current resulting from the charge pump circuit increases, a large current flow through instantaneously, which causes the power source voltage Vdd to drop. In particular, the large current has a large influence on the device that has a low power source voltage and hinders the performance of the circuit that is requested. For example, the operation of the input/output circuit may become unstable and errors may occur in the read data.

SUMMARY

In view of the above, the disclosure provides a semiconductor memory device that reducing the peak current during the read operation.

A semiconductor memory device according to the disclosure includes a memory cell array; a plurality of charge pump circuits; and a controller controlling a timing of activating the charge pump circuits when a selected page of the memory cell array is read so that the charge pump circuits are not activated at the same timing.

According to an embodiment, the controller controls the timing of activating the charge pump circuits when performing reading during a bit line precharge period. According to an embodiment, the controller shifts a timing of activating at least one charge pump circuit of the charge pump circuits. According to an embodiment, the controller activates a first charge pump circuit in response to the rising edge of the clock signal. According to an embodiment, the controller activates a second charge pump circuit, in response to a falling edge of a clock signal. According to an embodiment, the controller activates a third charge pump circuit in response to an odd-numbered rising edge of the clock signal and activates a fourth charge pump circuit in response to an even-numbered falling edge of the clock signal. According to an embodiment, the charge pump circuits include a charge pump circuit that generates a pass voltage to be applied to a non-selected page. According to an embodiment, the charge pump circuits include a charge pump circuit that generates a drive voltage for driving a selected transistor that is for supplying a voltage to a bit line. According to an embodiment, the reading includes verify-read during a program operation or an erase operation.

According to the disclosure, since the timing of activating the charge pump circuit is controlled during the read operation, the peak current during the read operation can be reduced. As a result, the noise of the power source voltage can also be reduced.

DESCRIPTION OF THE EMBODIMENTS

Figure 1:
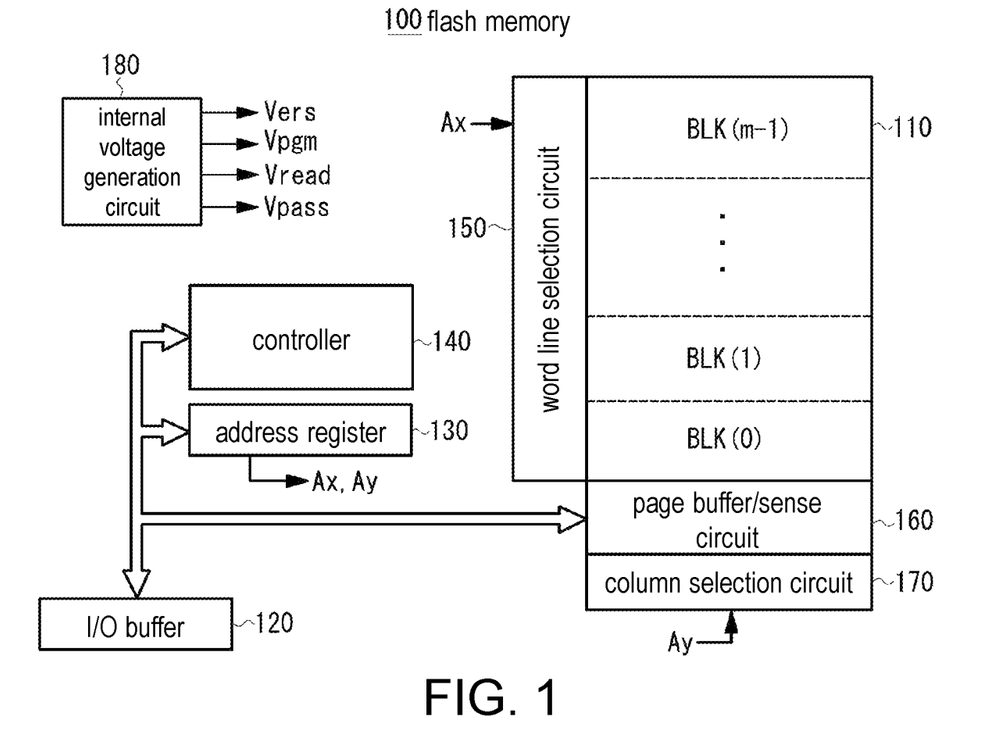
FIG. 1 is a diagram showing the configuration of the flash memory according to an embodiment of the disclosure.

Hereinafter, embodiments of the disclosure will be described in detail with reference to the drawings. Here, a NAND type flash memory is illustrated as an example. It should be noted that the drawings may emphasize some parts to facilitate understanding of the disclosure and are not necessarily drawn to the same scale as the actual devices.
Embodiments FIG. 1 shows a schematic configuration of the flash memory according to an embodiment of the disclosure. Nevertheless, the configuration of the flash memory shown here is an example and the disclosure is not necessarily limited to such a configuration.

The flash memory 100 of the present embodiment includes: a memory cell array 110 in which a plurality of memory cells are arranged in rows and columns; an input/output (I/O) buffer 120 connected to an external I/O terminal I/O; an address register 130 receiving address data from the I/O buffer 120; a controller 140 controlling each part based on command data received from the I/O buffer 120, an external control signal, or the like; a word line selection circuit 150 decoding row address information Ax from the address register 130 and performing selection of a block and selection of a page based on the decoding result; a page buffer/sense circuit 160 holding data read from the page selected by the word line selection circuit 150 and holding input data that is to be programmed to the selected page; a column selection circuit 170 decoding column address information Ay from the address register 130 and selecting data of a column address in the page buffer/sense circuit 160 based on the decoding result; and an internal voltage generation circuit 180 generating various voltages (write voltage Vpgm, pass voltage Vpass, erase voltage Vers, drive voltage VXD for row selection, etc.) required for reading, programming, and erasing data.

Figure 2:
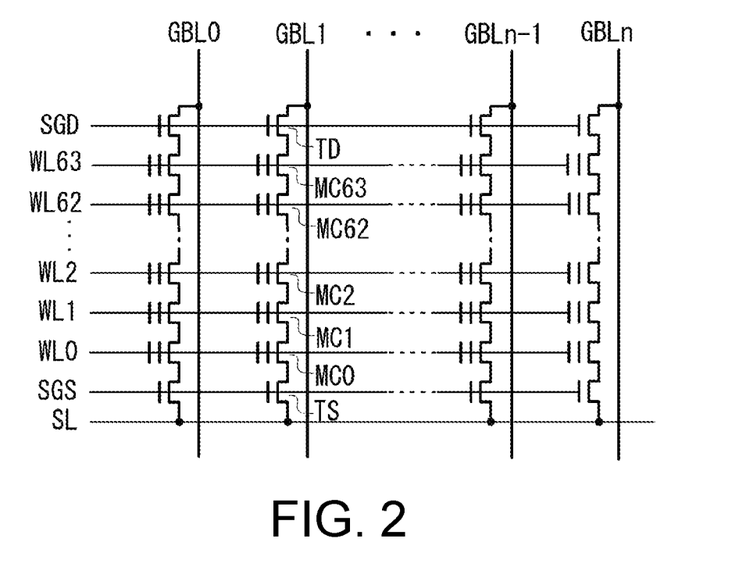
FIG. 2 is a diagram showing the configuration of the NAND string of the memory cell array according to an embodiment of the disclosure.

The memory cell array 110 has m memory blocks BLK(0), BLK(1) . . . BLK(m−1) in the column direction. In one memory block, as shown in FIG. 2, a plurality of NAND strings are formed. The NAND strings may be in the form of a two-dimensional array formed on the substrate surface or may be in the form of a three-dimensional array using a semiconductor layer formed on the substrate surface. One NAND string includes, for example, memory cells MC0, MC1 . . . MC62, and MC63, a bit line side selected transistor TD, and a source line side selected transistor TS, and these transistors are connected in series. One memory cell may be a SLC type that stores one bit (binary data) or may be a MLC type that stores multiple bits.

Figure 3:
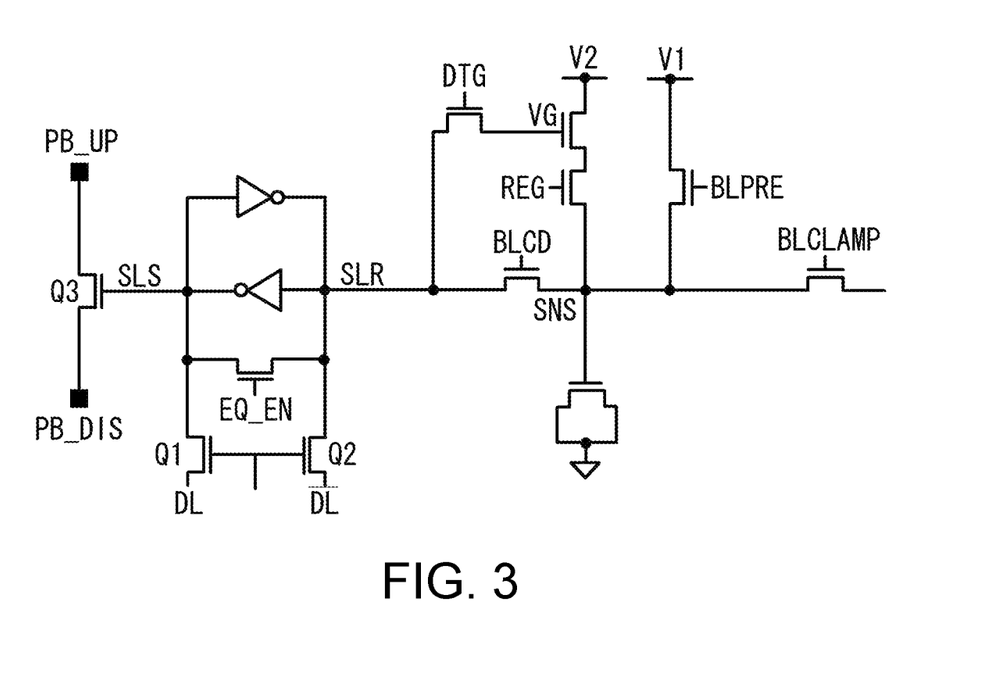
FIG. 3 is a diagram showing the configuration of the page buffer according to an embodiment of the disclosure.

FIG. 3 shows the configuration of the page buffer/sense circuit. The page buffer/sense circuit 160 includes a sense circuit sensing a bit line potential of the selected memory cell during the read operation or the like, and a latch circuit holding input data that is to be programmed, data read from the memory cell array, etc. The sense circuit includes a transistor BLPRE, which is a selection transistor of the page/buffer sense circuit 160 for precharging the voltage supplied from a voltage supply part V1 to the bit line, a transistor BLCLAMP for clamping the bit line, a transistor BLCD for transferring charges between a sense node SNS and a latch node SLR, a transistor DTG for transferring the potential of the latch node SLR to a transistor VG connected to a voltage supply part V2, and a transistor REG for coupling the voltage supply part V2 to the sense node SNS. The transistor DTG is operated, for example, when it is necessary to invert the sense node SNS from the L level to the H level in program verification, etc. The latch circuit includes a pair of cross-coupled inverters, a transistor EQ_EN for equalizing the nodes SLR/SLS, transistors Q1 and Q2 connecting the nodes SLR/SLS to the data lines DL and/DL, and a verification transistor Q3 connected to the node SLS.

In addition, the read operation may be performed alternately on even pages composed of even bit lines and odd pages composed of odd bit lines. In that case, a bit line selection circuit is connected to one page buffer/sense circuit, and the bit line selection circuit selects the even bit line or the odd bit line. When the even page is read, a shield potential of GND level is supplied to the odd bit lines of the odd page, and when the odd page is read, the shield potential of GND level is supplied to the even bit lines of the even page, by which the noise caused by capacitive coupling between adjacent bit lines is reduced.

Figure 4:
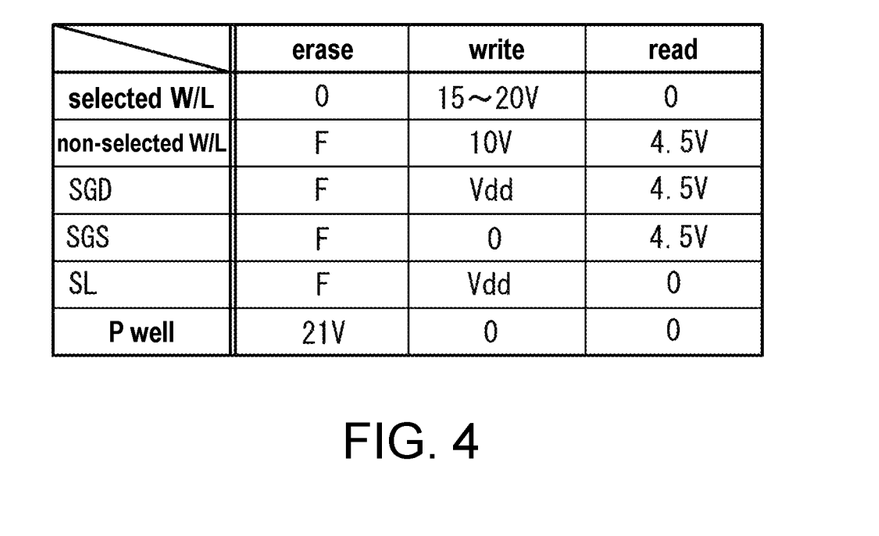
FIG. 4 is a table showing the bias voltages that are applied during operation of the NAND type flash memory.

FIG. 4 is a table showing an example of the bias voltages applied during each operation of the flash memory. In the read operation, a certain positive voltage is applied to the bit line, a certain voltage (for example, 0V) is applied to the selected word line, the pass voltage Vpass (for example, 4.5V) is applied to the non-selected word line, a positive voltage (for example, 4.5V) is applied to the selected gate lines SGD and SGS, the bit line side selected transistor and the source line side selected transistor of the NAND string are turned on, and 0V is applied to the common source line. In the program (write) operation, a high program voltage Vpgm (15V to 20V) is applied to the selected word line, an intermediate potential (for example, 10V) is applied to the non-selected word line, the bit line side selected transistor is turned on, the source line side selected transistor is turned off, and a potential corresponding to the data of "0" or "1" is supplied to the bit line. In the erase operation, 0V is applied to the selected word line in the block, a high voltage (for example, 20V) is applied to the P well, and the data is erased in units of block by extracting electrons of the floating gate to the substrate.

The internal voltage generation circuit 180 generates the voltages required for each operation. The internal voltage generation circuit 180 includes a charge pump circuit for boosting the power source voltage Vdd supplied from the outside, a level shifter for converting the voltage level generated by the charge pump circuit, etc.

Figure 5A:
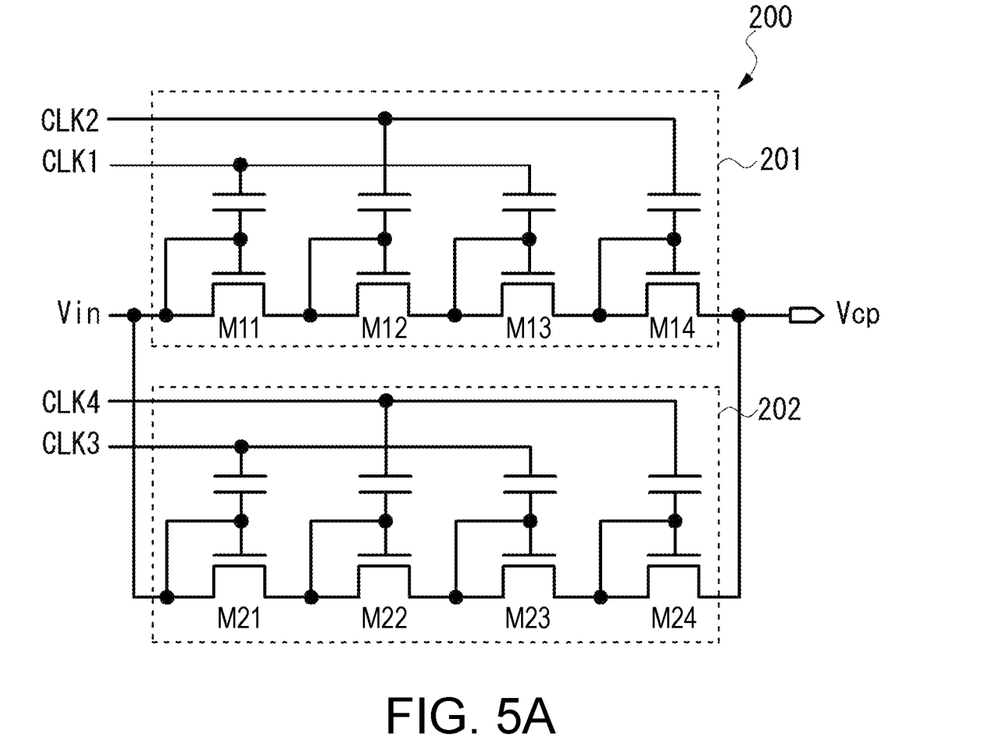
FIG. 5A and FIG. 5B are diagrams showing an example of the charge pump circuit.
Figure 5B:
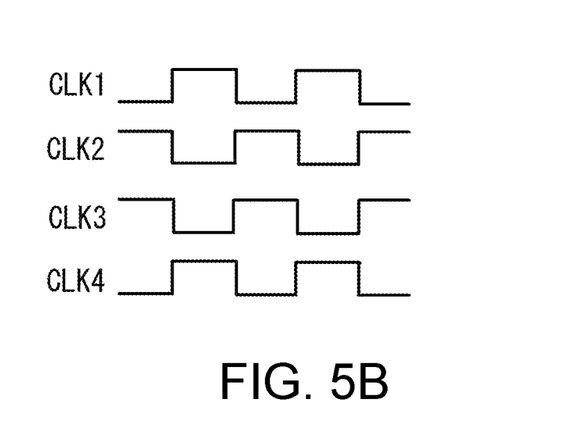

FIG. 5A shows an example of the charge pump circuit. The charge pump circuit 200 includes, for example, two charge pump circuit sets 201 and 202. The charge pump circuit set 201 includes, for example, a plurality of diode-connected MOS transistors, which are connected in series. A capacitor is connected to the gate of the MOS transistor, a clock signal CLK1 is applied to each capacitor of the odd-numbered MOS transistors, that is transistors M11 and M13, and a clock signal CLK2 is applied to each capacitor of the even-numbered MOS transistors, that is transistors M12 and M14. The charge pump circuit set 202 has the same configuration as the charge pump circuit set 201, but a clock signal CLK3 is applied to each capacitor of the odd-numbered MOS transistors, that is transistors M21 and M23 and a clock signal CLK4 is applied to each capacitor of the even-numbered MOS transistors, that is transistors M22 and M24. As shown in FIG. 5B, the clock signal CLK1 and the clock signal CLK2 have a relationship that their phases differ by 180 degrees. Moreover, the clock signal CLK1 has the same phase as the clock signal CLK4 while the clock signal CLK2 has the same phase as the clock signal CLK3. In the charge pump circuit, for example, the power source voltage Vdd is supplied to a voltage input part Vin, and the boosted voltage is outputted from a voltage output part Vcp.

In the case of this circuit configuration, the MOS transistor connected to the voltage output port Vcp of the charge pump circuit set 201 is activated by the rising edge of the clock signal CLK2, and the boosted voltage is supplied to the voltage output port Vcp. In addition, the MOS transistor connected to the voltage output port Vcp of the charge pump circuit set 202 is activated by the rising edge of the clock signal CLK4, and the boosted voltage is supplied to the voltage output port Vcp. Since the clock signal CLK2 and the clock signal CLK4 have the relationship that their phases differ by 180 degrees, the boosted voltage is supplied to the voltage output port Vcp at both the rising edge and the falling edge of a reference clock signal CLK1.

Figure 6:
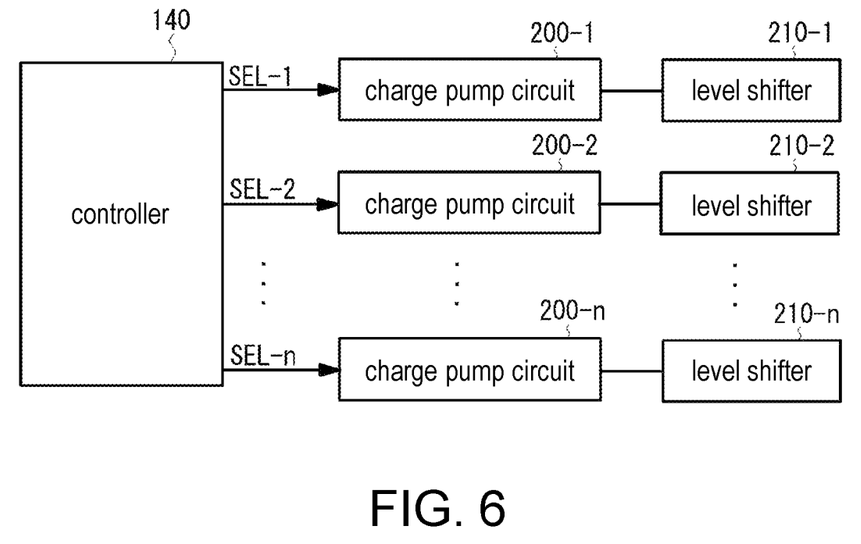
FIG. 6 is a diagram showing the configuration of the charge pump circuit according to an embodiment of the disclosure.

In an embodiment, as shown in FIG. 6, the internal voltage generation circuit 180 includes n charge pump circuits 200-1, 200-2 . . . 200-$n$ (n is an integer of 2 or more), and level shifters 210-1, 210-2 . . . 210-$n$ for shifting or regulating the voltage level generated by the charge pump circuits. Each charge pump circuit has the configuration shown in FIG. 5A, for example.

The multiple charge pump circuits 200-1, 200-2 . . . 200-$n$ may be selectively operated or not operated by selection signals SEL-1, SEL-2 . . . SEL-n from the controller 140. For example, during the read operation, the controller 140 operates the charge pump circuit 200-1 by the selection signal SEL-1, generates the pass voltage Vpass to be applied to the non-selected page, operates the charge pump circuit 200-2 by the selection signal SEL-2, and generates the drive voltage VXD for driving the selection transistor BLPRE of the page buffer/sense circuit 160. The charge pump circuit 200-1, for example, generates 9.6V and regulates it to 4.5V to be used as the pass voltage Vpass, and the charge pump circuit 200-2 generates a voltage, larger than the power source voltage Vdd and equal to or larger than a threshold value Vth of the transistor, as the drive voltage VXD.

Next, details of the charge pump circuit according to the present embodiment will be described. The controller 140 selects the charge pump circuits to be operated through the selection signals SEL-1, SEL-2 . . . SEL-n during the read operation and further controls the timing of activating the selected charge pump circuits. For example, the charge pump circuit is activated in response to the rising edge of the reference clock signal, the falling edge of the reference clock signal, or the rising edge and the falling edge of the reference clock signal.

Figure 7:
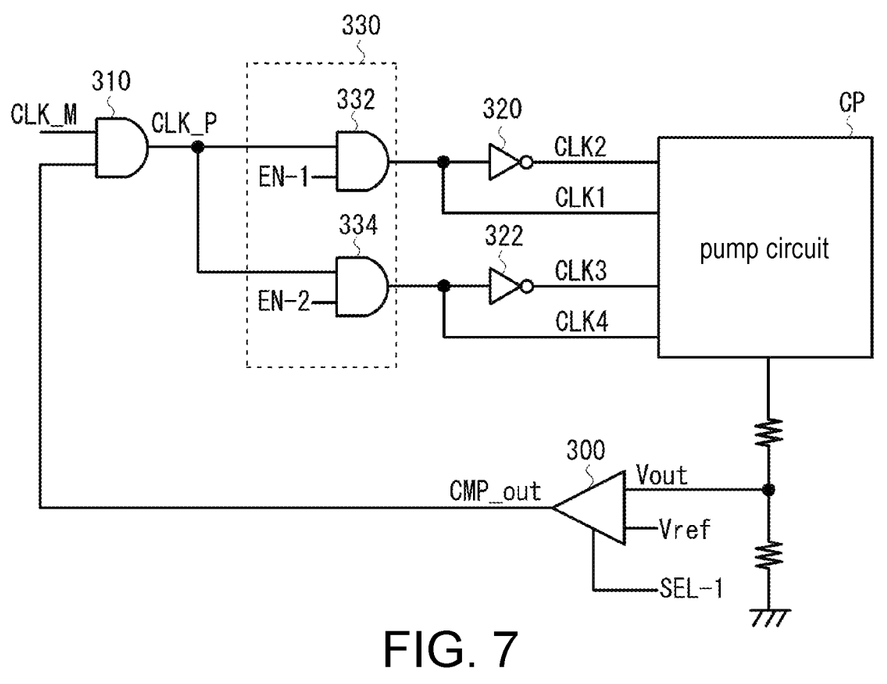
FIG. 7 is a diagram illustrating operation control of the charge pump circuit according to an embodiment of the disclosure.

FIG. 7 shows details of one charge pump circuit 200-1. Other charge pump circuits are configured in the same manner. With the selection signal SEL-1 from the controller 140 as the enable signal for the comparator 300, the output voltage Vout of a pump circuit CP shown in FIG. 7 is compared with a voltage Vref, i.e., a target voltage, by a comparator 300, and the comparison result CMP_out is inputted to a AND gate 310. A clock signal CLK_M is inputted to the other input terminal of the AND gate 310. When the selection signal SEL-1 is at the H level and the output voltage Vout≤the target voltage Vref, CMP_out is at the H level and the AND gate 310 outputs a clock having the same phase as the clock signal CLK_M as a clock signal CLK_P for pump. On the other hand, when the selection signal SEL-1 is at the H level and the output voltage Vout >the target voltage Vref, CMP_out is at the L level and the output of the AND gate 310 is fixed at the L level.

Similarly, when the selection signal SEL-1 is at the L level, CMP_out is at the L level and the output of the AND gate 310 is fixed at the L level.

The charge pump circuit 200-1 further includes a generation circuit 330 for generating the clock signal CLK1 and the clock signal CLK4 from the clock signal CLK_P, an inverter 320 generating the clock signal CLK2 by inverting the clock signal CLK1, and an inverter 322 generating the clock signal CLK3 by inverting the clock signal CLK4. As a result, the clock signals CLK1, CLK2, CLK3, and CLK4 are supplied to the pump circuit CP.

In an embodiment, the generation circuit 330 includes an AND gate 332 using the clock signal CLK_P and a enable signal EN-1 as input and using the clock signal CLK1 as output, and an AND gate 334 using the clock signal CLK_P and the enable signal EN-2 as input and using the clock signal CLK4 as output. These AND gates 332 and 334 are controlled independently by the enable signals EN-1 and EN-2. For example, when any of the enable signals EN-1 and EN-2 is set to the H level, the clock signals CLK1 and CLK4, which are outputs of the AND gates 332 and 334 corresponding to the respective enable signals, are the same as the clock signal CLK_P. On the other hand, when any of the enable signals EN-1 and EN-2 is set to the L level, the clock signals CLK1 and CLK4, which are outputs of the AND gates 332 and 334 corresponding to the respective enable signals, are fixed to the L level.

Figure 8A:
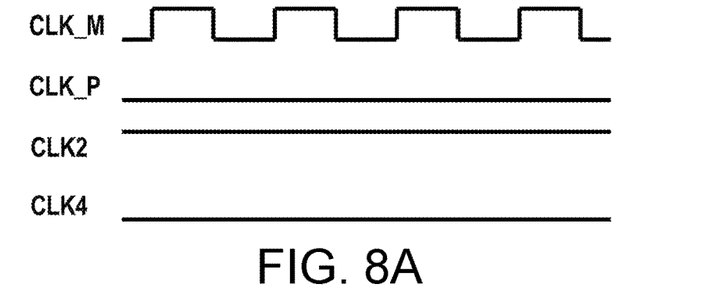
FIG. 8A is a diagram illustrating the clock signals when the pump circuit is not activated.

FIG. 8A to FIG. 8D show examples of the clock signal CLK_P for pump generated by the AND gate 310, and the clock signals CLK2 and CLK4 generated by the generation circuit 330 and the inverter 320. Here, it should be noted that the clock signals CLK2 and CLK4 are clock signals for activating the MOS transistors connected to the voltage output port Vcp of the charge pump circuit sets 201 and 202 of the pump circuit CP shown in FIG. 5A and FIG. 5B, respectively. FIG. 8A shows an example of the clock signal CLK_P for pump and the clock signals CLK2 and CLK4 that are generated when the comparison result CMP_out is set to the L level. That is, the output signal CLK_P of the AND gate 310 is fixed to the L level and the clock signals CLK2 and CLK4 are also fixed to the H level and the L level respectively, and the pump circuit CP is not activated and is inoperative.

Figure 8B:
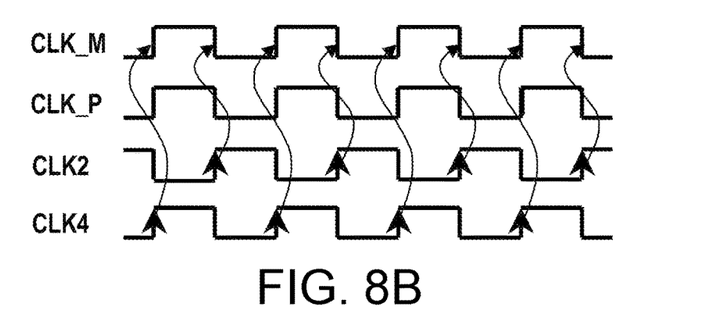
FIG. 8B is a diagram illustrating the clock signals generated in response to the rising edge and the falling edge.

FIG. 8B shows an example of the clock signal CLK_P for pump and the clock signals CLK2 and CLK4 that are generated when the comparison result CMP_out is set to the H level and the enable signals EN-1 and EN-2 are both set to the H level. That is, the output signal CLK_P of the AND gate 310 and the clock signal CLK4 are signals having the same phase as the clock signal CLK_M, but the clock signal CLK2 is generated as a signal having a phase that differs from the phase of the clock signal CLK_M by 180 degrees, and the pump circuit CP shown in FIG. 5A and FIG. 5B is activated in response to both the rising edge and the falling edge of the clock signal CLK_M.

Figure 8C:
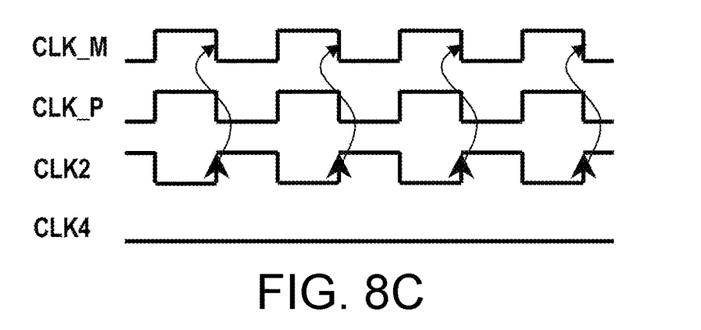
FIG. 8C is a diagram illustrating the clock signals generated in response to the falling edge.

FIG. 8C shows an example of the clock signal CLK_P for pump and the clock signals CLK2 and CLK4 that are generated when the comparison result CMP_out is set to the H level, the enable signal EN-1 is set to the H level, and the enable signal EN-2 is set to the L level. That is, the output signal CLK_P of the AND gate 310 is a signal having the same phase as the clock signal CLK_M, but the clock signal CLK2 is generated as a signal having a phase that differs from the phase of the clock signal CLK_M by 180 degrees. However, since the clock signal CLK4 is a signal fixed to the L level, only the charge pump circuit set 201 of the pump circuit CP shown in FIG. 5A and FIG. 5B operates and is activated only in response to the falling edge of the clock signal CLK_M.

Figure 8D:
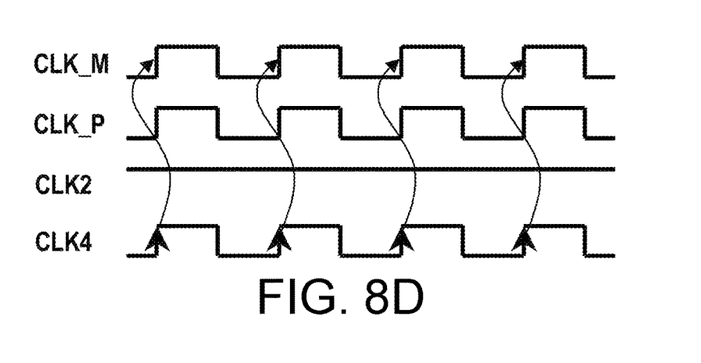
FIG. 8D is a diagram illustrating the clock signals generated in response to the rising edge.

FIG. 8D shows an example of the clock signal CLK_P for pump and the clock signals CLK2 and CLK4 that are generated when the comparison result CMP_out is set to the H level, the enable signal EN-1 is set to the L level, and the enable signal EN-2 is set to the H level. That is, since the output signal CLK_P of the AND gate 310 and the clock signal CLK4 are signals having the same phase as the clock signal CLK_M and the clock signal CLK2 is generated as a signal fixed to the H level, only the charge pump circuit set 202 of the pump circuit CP shown in FIG. 5A and FIG. 5B operates and is activated only in response to the rising edge of the clock signal CLK_M.

The embodiment shown in FIG. 5A, FIG. 5B, 7, and FIG. 8A to FIG. 8D illustrates the type that the charge pump circuit shown in FIG. 5A and FIG. 5B is activated in response to both the rising edge and the falling edge of the a reference clock CLK_M as an example. However, the disclosure is not limited to such a circuit configuration. For example, even if the pump circuit is a type that excludes the charge pump circuit set 202 from the charge pump circuit shown in FIG. 5A and is activated only in response to the rising edge of the clock signal CLK2, the configuration of the pump circuit can still be realized as follows: the generation circuit 330 uses the clock signal CLK_P from the CLK_M signal for pump as input; a rising/falling detection part for outputting a signal multiplied by 2, a rising detection part for outputting only odd-numbered pulses by multiplying by 2 signal, and a falling detection part for outputting only even-numbered pulses by multiplying by 2 are prepared; the rising/falling detection part, the rising detection part, and the falling detection part are controlled by enable signals respectively; and by activating only one detection part, the pump circuit is activated in response to both the rising and falling edges of reference clock signal CLK_M, only the rising edge of reference clock signal CLK_M, or only the falling edge of the clock signal CLK_M. In this case, the configurations of the rising/falling detection part, the rising detection part, and the falling detection part are not particularly limited, and are for example made by using a circuit using a flip-flop or the like, a multiplier circuit, a delay circuit, a logic circuit or the like. Furthermore, although the generation circuit 330 shown in FIG. 7 is configured using two AND gates, it is only an example, and other configurations may be adopted.

Next, the read operation of the flash memory according to the present embodiment will be described. Here, in addition to reading of the selected page in response to the address and command from the outside, the read operation also includes a read operation for verification that is performed during the program operation or the erase operation.

Figure 9:
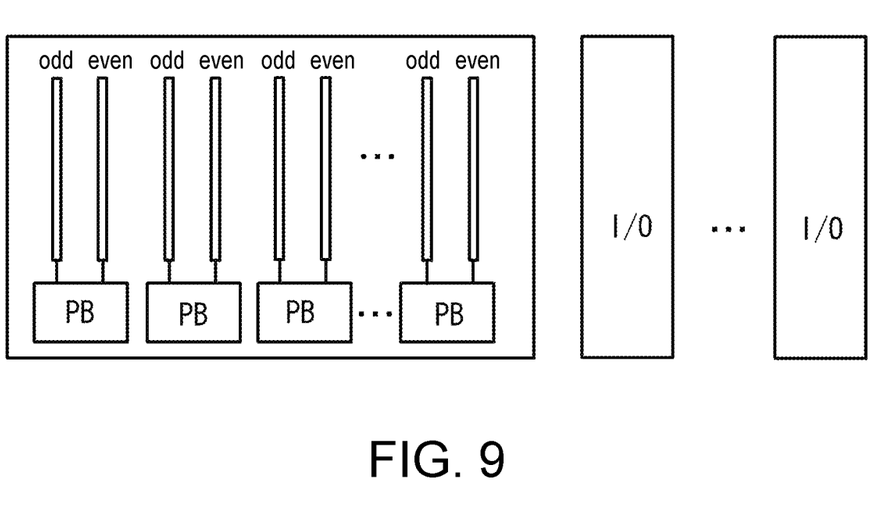
FIG. 9 is a diagram showing a configuration example of the page buffer and the bit line according to an embodiment of the disclosure.

When starting the read operation, the controller 140 precharges the even bit lines of the even page or the odd bit lines of the odd page. FIG. 9 illustrates the relationship between I/O of the flash memory and the bit lines. For example, when the flash memory 100 has 16 I/O terminals, 2048 bit lines are allocated to one I/O terminal (1024 even bit lines and 1024 odd bit lines). In all the 16 I/Os, there are 32,768 bit lines (16,384 even bit lines and 16,384 odd bit lines). If a current of 1 pA is required to precharge the capacity of one bit line, a current of 16,384 pA is required to precharge all the bit lines of the even page. Thus, the capacity of all the bit lines is very large. Therefore, during the read operation, the peak current in the precharge period of the bit lines is the largest compared to other periods.

Therefore, in the present embodiment, the timing at which the charge pump circuit is activated is controlled, so as to reduce the peak current during the precharge period of the bit lines. An example of activating two charge pump circuits will be described here. One is the charge pump circuit for generating the pass voltage Vpass (a voltage for conducting the memory cell irrespective of the state of the memory cell) to be applied to the non-selected word line in the selected block, and the other is the charge pump circuit for generating the selected gate voltage VXD to be applied to the gate of the selection transistor for supplying the power source voltage Vdd of the page buffer/sense circuit 160 to the bit line during precharge. When the power source voltage Vdd from the outside is, for example, 1.8V, the unregulated pass voltage Vpass is 9.6V and the unregulated voltage VXD is, for example, 5.4V. For example, the controller 140 enables two selection signals SEL-1 and SEL-2 to the H level in order to operate the two charge pump circuits 200-1 and 200-2 shown in FIG. 6.

Figure 10A:
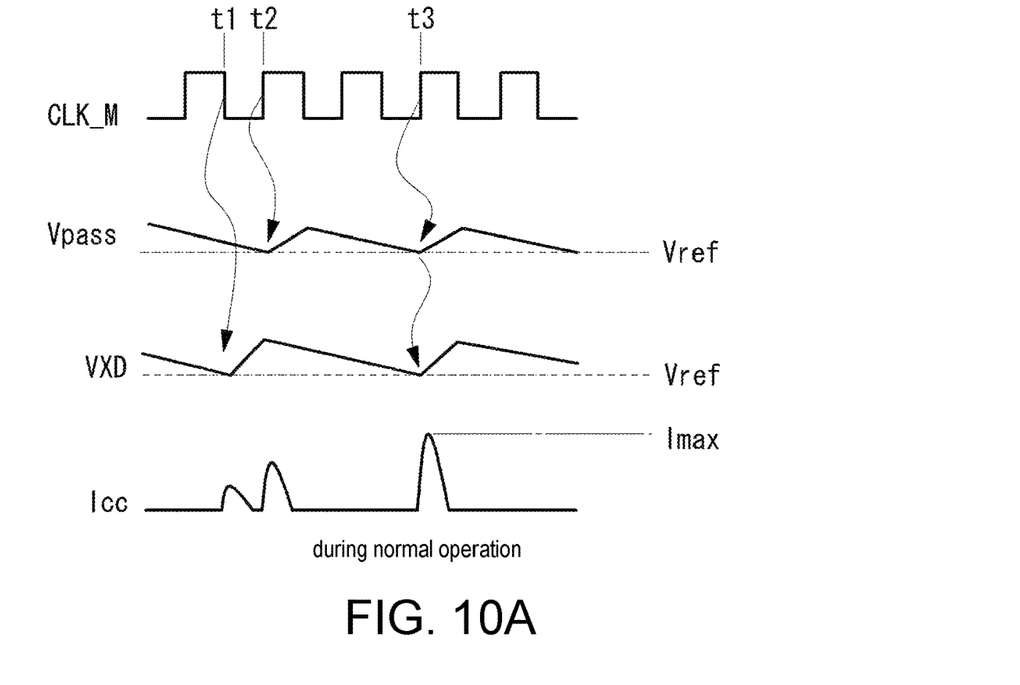
FIG. 10A and FIG. 10B are diagrams illustrating the operation of the charge pump circuit during the read operation according to an embodiment of the disclosure.

FIG. 10A shows the relationship between the operation of the charge pump circuit and current consumption during the normal operation. During the normal operation, the two selected charge pump circuits 200-1 and 200-2 are activated in response to both the rising edge and the falling edge of the clock signal CLK_M. That is, the controller 140 operates the AND gates 332 and 334 through the enable signals EN-1 and EN-2 shown in FIG. 7 and supplies the clock signals CLK2 and CLK4 shown in FIG. 8B and also the clock signals CLK1 and CLK3 having phases that respectively differ from those of CLK2 and CLK4 by 180 degrees to the charge pump circuit. As a result, the charge pump circuits 200-1 and 200-2 effectively operate in response to both the rising edge and the falling edge of the clock signal CLK_M. For example, with reference to FIG. 7, if the drive voltage VXD drops below the target voltage Vref at the falling edge at the time t1, the charge pump circuit 200-1 is started, and if the pass voltage Vpass drops below the target voltage Vref at the rising edge at the time t2, the charge pump circuit 200-2 is started. Moreover, if the drive voltage VXD and the pass voltage Vpass drop below the target voltage Vref at the rising edge at the time t3, the charge pump circuits 200-1 and 200-2 are started. In this case, since the two charge pump circuits are started at the same time, the current consumption Icc caused by the charge pump circuits is maximized.

Figure 10B:
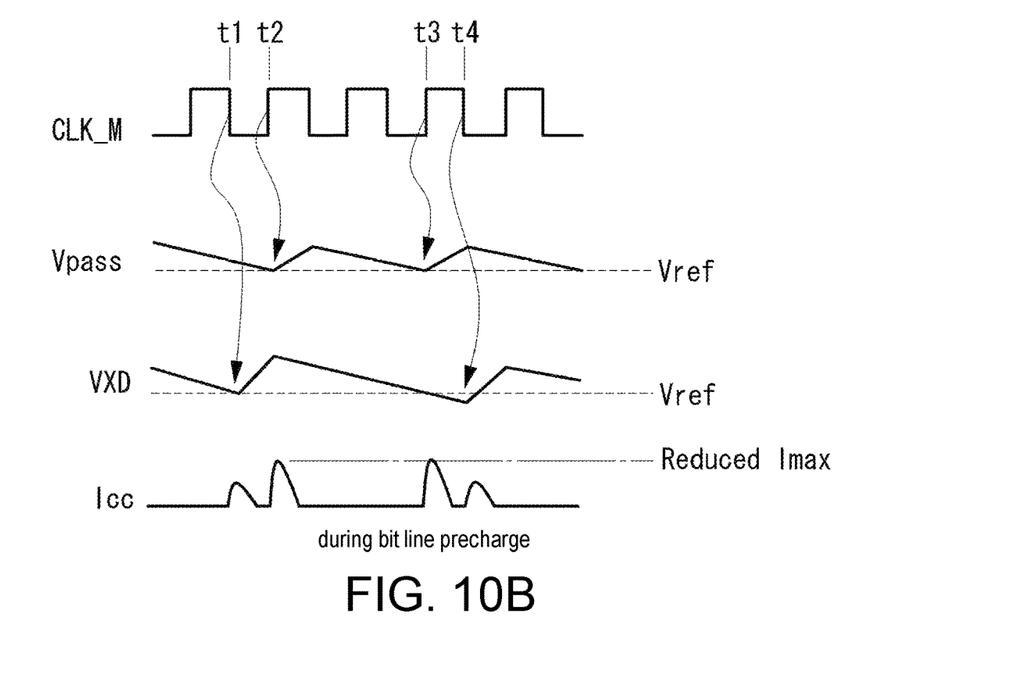

FIG. 10B shows the relationship between the operation of the charge pump circuit and the current consumption during the bit line precharge period. During the precharge period of the bit line, for example, the controller 140 operates the AND gate 334 of the generation circuit 330 of the charge pump circuit 200-1 that is for generating the pass voltage Vpass (the other detection parts are inoperative) and operates the AND gate 332 of the generation circuit 330 of the charge pump circuit 200-2 that is for generating the drive voltage VXD (the other detection parts are inoperative). In other words, the charge pump circuit 200-1 and the charge pump circuit 200-2 are not activated at the same timing. The precharge period of the bit line is, for example, a period during which the BLPRE transistor shown in FIG. 3 is turned on, and the controller 140 sets the enable signal EN-2 of the charge pump circuit 200-1 to H (the enable signal EN-1 is L) in synchronization with the timing of turning on the BLPRE transistor, outputs EN-1 to the generation circuit 330 of the charge pump circuit 200-2 (the enable signal EN-2 is L), and sets both the enable signals EN-1 and EN-2 of the charge pump circuits 200-1 and 200-2 to H in synchronization with the timing of turning off the BLPRE transistor.

In FIG. 10B with reference to FIG. 7, the pass voltage Vpass and the drive voltage VXD are lower than the target voltage Vref at the rising edge at the time t3, but at this time, only the charge pump circuit 200-1 is activated and the charge pump circuit 200-2 is not activated. At the falling edge at the time t4, since the drive voltage VXD is lower than the target voltage Vref, the charge pump circuit 200-2 is activated. At the time t3, since the charge pump circuits 200-1 and 200-2 are not activated at the same time and the activation of the charge pump circuit 200-2 is shifted to the time t4, the current consumption Icc caused by the charge pump circuits 200-1 and 200-2 is dispersed, and the maximum current consumption Imax in FIG. 10A is reduced.

Figure 11:
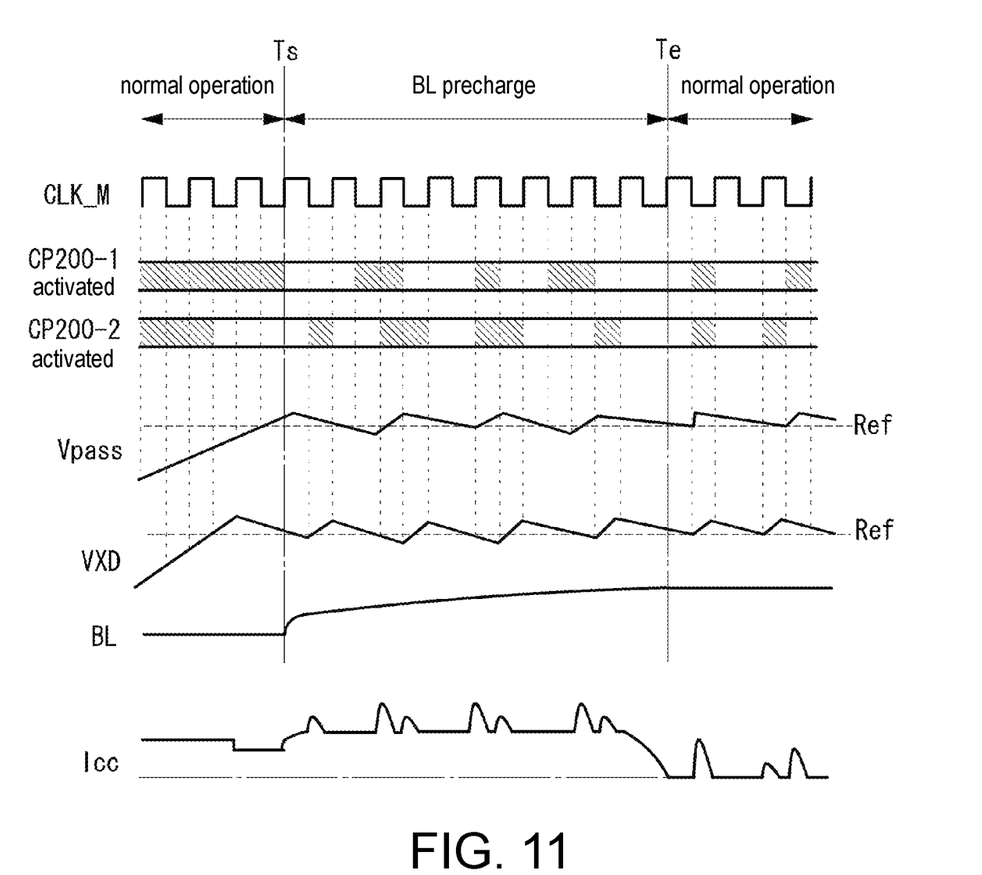
FIG. 11 is a timing chart illustrating the operation of the charge pump circuit during the read operation according to an embodiment of the disclosure.

FIG. 11 shows a detailed timing chart of the charge pump circuit during the bit line precharge. In FIG. 11 with reference to FIG. 7, the activation states of the charge pump circuits 200-1 and 200-2 are indicated by hatching. The normal operation (see FIG. 10A) is the period from the start of the read operation to the time Ts when the precharge of the bit line starts. During this period, the charge pump circuits 200-1 and 200-2 operate in response to the rising edge and the falling edge of the clock signal CLK_M if the pass voltage Vpass and the drive voltage VXD are lower than the target voltage Vref.

The precharge period of the bit line is the period from the time Ts to the time Te. During this period, the charge pump circuit 200-1 operates in response to the rising edge of the clock signal CLK_M if the pass voltage Vpass is lower than the target voltage Vref and the charge pump circuit 200-2 operates in response to the falling edge of the clock signal CLK_M if the drive voltage VXD is lower than the target voltage Vref. After the time Te, the charge pump circuits 200-1 and 200-2 return to the normal operation again.

Thus, by preventing the charge pump circuits from being activated at the same time during the precharge period of the bit line, it is possible to reduce the peak current during the bit line precharge period when the current consumption is maximized.

The above embodiment illustrates an example that two charge pump circuits are operated during the precharge period of the bit line, but it is only an example. It is also possible to operate n charge pump circuits (n is an integer of 2 or more). In that case, all of the n charge pump circuits may not be activated at the same time, or some charge pump circuits may be activated at the same time. For example, one or more charge pump circuits may be activated in response to the rising edge of a reference clock signal, one or more charge pump circuits may be activated in response to the falling edge of the reference clock signal, and one or more charge pump circuits may be activated in response to the rising edge and the falling edge of the reference clock signal. Alternatively, the first charge pump circuit may be activated in response to the rising edge of the reference clock signal, the second charge pump circuit may be activated in response to the falling edge of the reference clock signal, the third charge pump circuit may be activated in response to the odd-numbered rising edge of the reference clock signal, and the fourth charge pump circuit may be activated in response to the even-numbered falling edge of the reference clock signal. The timing at which the charge pump circuit is activated may be set as desired.

Although exemplary embodiments of the disclosure have been described in detail above, the disclosure is not limited to specific embodiments, and various modifications and changes may be made within the scope of the disclosure defined in the claims.

What is claimed is:

1. A semiconductor memory device, comprising:
a memory cell array in a chip;
a plurality of charge pump circuits, arranged in the chip; and
a controller, arranged in the chip and controlling a timing of activating the charge pump circuits when a selected page of the memory cell array is read so that the charge pump circuits are not activated at the same timing,
wherein each of the plurality of charge pump circuits comprise:
a pump circuit;
a generation circuit receiving a clock signal to generate a first clock signal and a fourth clock signal;
a first inverter receiving and inverting the first clock signal to generate a second clock signal; and
a second inverter receiving and inverting the fourth clock signal to generate a third clock signal,
wherein the first, second, third, and fourth clock signals are provided to the pump circuit.

2. The semiconductor memory device according to claim 1, wherein the controller controls the timing of activating the charge pump circuits when performing reading during a bit line precharge period.

3. The semiconductor memory device according to claim 1, wherein the controller shifts a timing of activating at least one charge pump circuit of the charge pump circuits.

4. The semiconductor memory device according to claim 1, wherein the controller activates a first charge pump circuit in response to a rising edge of a clock signal.

5. The semiconductor memory device according to claim 4, wherein the controller activates a second charge pump circuit in response to the falling edge of the clock signal.

6. The semiconductor memory device according to claim 1, wherein the controller activates a third charge pump circuit in response to an odd-numbered rising edge of a clock signal and activates a fourth charge pump circuit in response to an even-numbered falling edge of a clock signal.

7. The semiconductor memory device according to claim 1, wherein the charge pump circuits comprise a charge pump circuit that generates a pass voltage to be applied to a non-selected page.

8. The semiconductor memory device according to claim 1, wherein the charge pump circuits comprise a charge pump circuit that generates a drive voltage for driving a selected transistor that is for supplying a voltage to a bit line.

9. The semiconductor memory device according to claim 1, wherein a reading comprises verify-read during a program operation or an erase operation.

10. The semiconductor memory device according to claim 1, wherein the generation circuit comprises:
a first AND gate using the clock signal and a first enable signal as input and using the clock signal as output; and
a second AND gate using the clock signal and a second enable signal as input and using the fourth clock signal as output,
wherein the first AND gate and the second AND gate are independently controlled by the first enable signal and the second enable signal respectively.

11. The semiconductor memory device according to claim 1, wherein a selection signal outputted by the controller serves as an enable signal of a comparator,
the comparator compares an output voltage of the pump circuit with a target voltage to generate a comparison result, and
an AND gate receives the comparison result to generate the clock signal.

12. The semiconductor memory device according to claim 1, wherein during a normal operation, controlling the charge pump circuits to be activated at the same time.

13. A semiconductor memory device, comprising:
a memory cell array in a chip;
a plurality of charge pump circuits, arranged in the chip; and
a controller, arranged in the chip and controlling a timing of activating the charge pump circuits when a selected page of the memory cell array is read so that the charge pump circuits are not activated at the same timing,
wherein the controller controls the timing of activating the charge pump circuits when performing reading during a bit line precharge period.

14. The semiconductor memory device according to claim 13, wherein the controller shifts a timing of activating at least one charge pump circuit of the charge pump circuits.

15. The semiconductor memory device according to claim 13, wherein the controller activates a first charge pump circuit in response to a rising edge of a clock signal.

16. The semiconductor memory device according to claim 15, wherein the controller activates a second charge pump circuit in response to the falling edge of the clock signal.

17. The semiconductor memory device according to claim 13, wherein the controller activates a third charge pump circuit in response to an odd-numbered rising edge of a clock signal and activates a fourth charge pump circuit in response to an even-numbered falling edge of a clock signal.

18. The semiconductor memory device according to claim 13, wherein the charge pump circuits comprise a charge pump circuit that generates a pass voltage to be applied to a non-selected page.

19. The semiconductor memory device according to claim 13, wherein the charge pump circuits comprise a charge pump circuit that generates a drive voltage for driving a selected transistor that is for supplying a voltage to a bit line.

* * * * *